(12) United States Patent
Baklanov et al.

(10) Patent No.: US 8,974,870 B2
(45) Date of Patent: Mar. 10, 2015

(54) FABRICATION OF POROGEN RESIDUES FREE LOW-K MATERIALS WITH IMPROVED MECHANICAL AND CHEMICAL RESISTANCE

(75) Inventors: Mikhail Baklanov, Veltem-Beisem (BE); Quoc Toan Le, Namur (BE); Laurent Souriau, Leuven (BE); Patrick Verdonck, Zaventem (BE)

(73) Assignee: IMEC, Leuven (BE)

( * ) Notice: Subject to any disclaimer, the term of this patent is extended or adjusted under 35 U.S.C. 154(b) by 661 days.

(21) Appl. No.: 13/226,208

(22) Filed: Sep. 6, 2011

(65) Prior Publication Data

US 2012/0052692 A1    Mar. 1, 2012

Related U.S. Application Data

(63) Continuation-in-part of application No. 12/831,935, filed on Jul. 7, 2010.

(60) Provisional application No. 61/223,961, filed on Jul. 8, 2009.

(51) Int. Cl.
*H05H 1/00* (2006.01)
*B05D 3/06* (2006.01)
(Continued)

(52) U.S. Cl.
CPC .............. *C23C 16/401* (2013.01); *C23C 16/56* (2013.01); *H01L 21/02126* (2013.01); *H01L 21/02203* (2013.01); *H01L 21/0234* (2013.01); *H01L 21/02348* (2013.01); *H01L 21/3105* (2013.01); *H01L 21/31633* (2013.01); *H01L 21/7682* (2013.01); *H01L 2221/1047* (2013.01)

USPC ............ 427/558; 427/535; 427/537; 427/559

(58) Field of Classification Search
CPC .... C23C 16/401; C23C 16/402; C23C 16/56; H01L 21/02203; H01L 21/02211; H01L 21/0234; H01L 21/02348; H01L 21/3105; H01L 21/31051
USPC .................. 427/535, 536, 537, 553, 558, 559
See application file for complete search history.

(56) References Cited

U.S. PATENT DOCUMENTS 6,271,084 B1 *   8/2001   Tu et al. ........................ 438/253
7,253,125 B1 *   8/2007   Bandyopadhyay et al. .. 438/795
(Continued)

FOREIGN PATENT DOCUMENTS

EP        1 873 818 A2     2/2008

OTHER PUBLICATIONS

Bilodeau, S.M., et al. Chemical Routes to Improved Mechanical Properties of PECVD Low K Thin Films, Materials Research Society Symp. Proc. vol. 812, 2004.
(Continued)

*Primary Examiner* — Michael Wieczorek
(74) *Attorney, Agent, or Firm* — Knobbe, Martens, Olson and Bear

(57) ABSTRACT

Methods for fabricating porous low-k materials are provided, such as plasma enhanced chemically vapor deposited (PE-CVD) and chemically vapor deposited (CVD) low-k films used as dielectric materials in between interconnect structures in semiconductor devices. More specifically, a new method is provided which results in a low-k material with significant improved chemical stability and improved elastic modulus, for a porosity obtained.

16 Claims, 7 Drawing Sheets

(51) Int. Cl.
*B05D 3/02* (2006.01)
*C23C 16/40* (2006.01)
*C23C 16/56* (2006.01)
*H01L 21/02* (2006.01)
*H01L 21/3105* (2006.01)
*H01L 21/316* (2006.01)
*H01L 21/768* (2006.01)

(56) References Cited

U.S. PATENT DOCUMENTS

| | | | |
|---|---|---|---|
| 7,282,458 B2 * | 10/2007 | Gates et al. | 438/778 |
| 2007/0299239 A1 * | 12/2007 | Weigel et al. | 528/349 |
| 2008/0166498 A1 | 7/2008 | Chen et al. | |
| 2008/0220619 A1 | 9/2008 | Matsushita et al. | |
| 2009/0104774 A1 * | 4/2009 | Furukawa et al. | 438/680 |
| 2011/0006406 A1 * | 1/2011 | Urbanowicz et al. | 257/632 |

OTHER PUBLICATIONS

Grill, A., et al. Hydrogen plasma effects on ultralow-k porous SiCOH dielectrics, Journal of Applied Physics 98, 074502 (2005).

Kemeling et al., Microelectronic Engineering, vol. 84, Issue 11, Nov. 2007, pp. 2575-2581.

Urbanowicz et al., Electrochemical and Solid-State Letters, vol. 12, H292 (2009).

* cited by examiner

US 8,974,870 B2

FABRICATION OF POROGEN RESIDUES FREE LOW-K MATERIALS WITH IMPROVED MECHANICAL AND CHEMICAL RESISTANCE

CROSS-REFERENCE TO RELATED APPLICATIONS

This application is a continuation-in-part of U.S. application Ser. No. 12/831,935, filed Jul. 7, 2010, which claims the benefit under 35 U.S.C. §119(e) of U.S. Provisional Application No. 61/223,961, filed Jul. 8, 2009, the disclosures of which are hereby expressly incorporated by reference in their entirety and are hereby expressly made a portion of this application.

FIELD OF THE INVENTION

Methods for fabricating porous low-k materials are provided, such as plasma enhanced chemically vapor deposited (PE-CVD) and chemically vapor deposited (CVD) low-k films used as dielectric materials in between interconnect structures in semiconductor devices. More specifically, a new method is provided which results in a low-k material with significant improved chemical stability and improved elastic modulus, for a porosity obtained.

BACKGROUND OF THE INVENTION

An elastic modulus, or modulus of elasticity, is the mathematical description of an object or substance's tendency to be deformed elastically (i.e., non-permanently) when a force is applied to it. The elastic modulus of an object is defined as the slope of its stress-strain curve in the elastic deformation region:

$$\lambda \stackrel{def}{=} \frac{stress}{strain}$$

where lambda ($\lambda$) is the elastic modulus; stress is the force causing the deformation divided by the area to which the force is applied; and strain is the ratio of the change caused by the stress to the original state of the object. If stress is measured in Pascal, since strain is a unitless ratio, then the units of $\lambda$ are Pascal as well. Since the denominator becomes unity if length is doubled, the elastic modulus becomes the stress needed to cause a sample of the material to double in length. While this endpoint is not realistic because most materials will fail before reaching it, it is practical, in that small fractions of the defining load will operate in exactly the same ratio. Thus for steel with an elastic modulus of 30 million pounds per square inch, a 30 thousand psi load will elongate a 1 inch bar by one thousandth of an inch, and similarly for metric units, where a thousandth of the modulus in GPascal (GPa) will change a meter by a millimeter.

Specifying how stress and strain are to be measured, including directions, allows for many types of elastic moduli to be defined. The three primary ones are: Young's modulus (E) describes tensile elasticity, or the tendency of an object to deform along an axis when opposing forces are applied along that axis; it is defined as the ratio of tensile stress to tensile strain. It is often referred to simply as the elastic modulus. In the present application elastic modulus primarily relates to the Young's modulus; the shear modulus or modulus of rigidity (G or $\mu$) describes an object's tendency to shear (the deformation of shape at constant volume) when acted upon by opposing forces; it is defined as shear stress over shear strain. The shear modulus is part of the derivation of viscosity; and the bulk modulus (K) describes volumetric elasticity, or the tendency of an object to deform in all directions when uniformly loaded in all directions; it is defined as volumetric stress over volumetric strain, and is the inverse of compressibility. The bulk modulus is an extension of Young's modulus to three dimensions.

The ITRS roadmap for scaling of ultra-large-scale integrated circuits requires mechanically robust dielectric materials with a low k-value. Low-k materials currently used in Cu/low-k integration scheme have k-values between 2.7 and 3.0. One of the limiting factors in further reduction of k-value is mechanical robustness, since more than 32% of porosity needs to be introduced to a Plasma Enhanced Chemically Vapor Deposited (PE-CVD) or Chemically Vapor deposited (CVD) low-k film to achieve the k-values below 2.3.

In state of the art (Kemeling et al. in Microelectronic Engineering Volume 84, Issue 11, November 2007, Pages 2575-2581) PE-CVD deposited low-k films such as Aurora® ELK films are fabricated by PE-CVD of a SiCOH matrix precursor and an organic porogen material. The porogen material is then removed during a subsequent thermally assisted UV-cure step with a short wavelength UV-lamp ($\lambda$<200 nm). In the best case this results in film thickness shrinkage of 13.2% and a robust low-k film with k-value of 2.3 and elastic modulus of 5.0 GPa.

A further increase in elastic modulus without altering the k value (porosity) and/or the chemical stability is desired in order to withstand further processing and reliability of the device (such as dry-etch patterning or chemical mechanical polishing (CMP) process).

BRIEF DESCRIPTION OF THE DRAWINGS

Figures are intended to illustrate various aspects and examples of the invention. The figures are depicted in a simplified way for reason of clarity. Not all alternatives and options are shown therein. The invention is not limited to the content of the given drawings. Like numerals are employed to reference like parts in the different figures.

DETAILED DESCRIPTION OF THE PREFERRED EMBODIMENTS

Figure 1A:
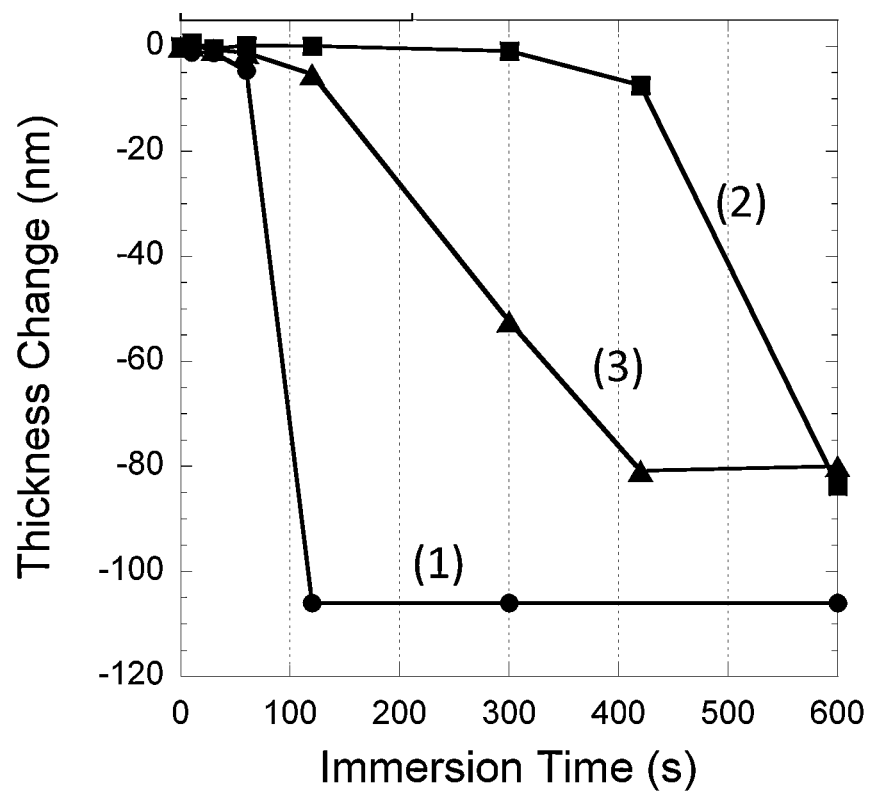
FIG. 1(a) illustrates the thickness change (as a measure of the chemical stability) of a organosilicate glass (OSG) low-k material as function of the immersion time in a HF0.5% solution wherein said low-k material has been (1) treated with UV having a wavelength lower than 200 nm (A-cure), (2) treated with UV having a wavelength higher than or equal to 200 nm (B-cure) and (3) treated with UV B-cure B followed by UV A-cure.

Various embodiments of the present application disclose a curing procedure for Plasma Enhanced Chemical Vapor Deposited (PE-CVD) and Chemical Vapor Deposited (CVD) SiCOH films in order to achieve a porogen-residue-free ultra low-k film with porosity higher than 40% and a high elastic modulus (higher than 5 GPa).

A low-k film cured by a sequence comprising a plasma treatment (H$_2$-comprising plasma afterglow, e.g. comprising He/H$_2$) and an Ultra-Violet (UV) exposure does not have optimal properties for further processing during the different process steps of an integration flow.

Under optimal properties it is understood chemical resistance/stability during the plasma processing and/or the contact with the wet chemistries and mechanical resistance during the e.g. chemical mechanical polishing (CMP). Either chemical resistance or mechanical resistance can be improved separately. The method of the preferred embodiments has the advantage of improving both chemical resistance/stability and mechanical resistance of the low-k material at the point in the integration flow where this is required.

The UV exposure can be performed either with a UV light having single wave length (172 nm), or broad band (B, with a wavelength>200 nm) UV light.

The parent application discloses a method which avoids having remaining porogen residues by performing a treatment of the PE-CVD and CVD-deposited SiCOH films in the afterglow of a hydrogen (H$_2$)-based plasma (with optional additions of noble gasses such as He, Ar) at elevated temperatures in the range of 200° C.-350° C., prior to the UV assisted thermal curing step. A Reactive ion etching plasma (RIE) is to be avoided and will not result in the desired result. Furthermore additions of nitrogen are to be avoided.

When after the treatment with the H2-based plasma a UV assisted thermal curing is applied with a UV light with the wavelength of 172 nm the low-k film obtained has good mechanical properties (Young Modulus>6 GPa), but low chemical resistance to plasma and wet chemistry. The chemical resistance is required such that the cured low-k film can withstand the next steps in a process integration flow, i.e. patterning process comprising dry-etch and wet-etch (or wet-strip) process steps.

If alternatively, after the treatment with the H2-based plasma, a UV assisted thermal curing is applied with a UV light of a B lamp (with a wavelength>200 nm) the chemical resistance (towards plasma and wet chemistries) of the low-k film is significantly improved, but the cured low-k material has a low mechanical resistance (Young Modulus of about 3.5 GPa).

The method according to preferred embodiments hence involves in a first step a substantially (typically more than 95%) complete removal of the porogens by atomic hydrogen at elevated temperature (200° C.-350° C.). The atomic hydrogen might be generated using a hydrogen comprising plasma afterglow or any other equivalent means. Then in a second step a UV-assisted thermal curing step. The preferred embodiments involve performing first a treatment with atomic hydrogen in order to remove most of the porogens present in the matrix of the SiCOH film. Advantageously, during said treatment the matrix remain unchanged.

After complete removal of the porogen, a first UV curing step is performed with a UV light having a wavelength higher or equal to 200 nm, i.e. a UV light generated by a broad band lamp with the wavelength higher than 200 nm. Hereinafter, this UV curing step is referred to as "UVB" or "B-cure or "cure-B". Thereby the low-k material (SiCOH film) is cured without depleting the Si—CH$_3$ bonds as shown in a further example, which confers an improved chemical resistance to the cured low-k film.

Without wishing to be bound by theory it is believed that the presence of Si—CH$_3$ bonds improves the chemical stability of the low-k material. During plasma processing or wet processing both fluorinated ions and/or other radicals are preferentially attacking Si that has a positive charge. The presence of methyl termination acts as a steric hindrance against this attack, thereby preventing skeleton damage during plasma or wet chemical processing.

Advantageously, the low-k film (material) having improved chemical resistance can better withstand the patterning (e.g. plasma dry-etch) and wet chemical processes (e.g. post plasma etch cleaning or striping) subsequent to the first UV curing step.

At the same time, the presence of Si—CH$_3$ bonds implies also less network forming atoms which leads to a low-k material (as results of the first curing step) having a smaller Young modulus, thus a lower mechanical resistance.

After performing the patterning and the wet chemical processes referred in the preceding paragraph, a second UV curing step is performed with a UV light having a wavelength lower than 200 nm, i.e. a wavelength of 172 nm (generated by i.e. a monochromatic UV lamp) or a combination of UV light having a wavelength of 172 nm and a UV light having a wavelength of 185 nm, thereby subjecting the low-k material (film) to a second cure step. Hereinafter the second cure step is referred to as "UVA" or "A-cure" or "cure-A". The UV light with a wavelength lower than 200 nm promotes the cross-linking reactions thereby improving the mechanical properties of the low-k material.

Consequently, the low-k film (material) after the second cure step has improved mechanical properties. The improved mechanical properties refer to an improved elastic (Young) modulus, i.e. an elastic modulus higher than 3.5 GPa, more preferably higher than 5 GPa.

The second cure step is performed after the process step(s) wherein chemical resistance is required, e.g. patterning and/or wet chemical processing.

The second cure step is performed prior to the process step(s) wherein mechanical resistance is required, e.g. chemical mechanical polishing (CMP) and/or packaging.

In between the steps of patterning and the step of CMP the process integration flow may comprise additional process steps such as: depositing sealing and/or barrier thin film layer(s) on the patterned structures defined in the low-k material, filling the patterned structures with a metal, thermal treatment of the substrate comprising the low-k material.

In specific embodiments the second cure step (A-cure) is repeated at least once before performing a process step where mechanical resistance is required (e.g. CMP) thereby improving further the Young modulus of the low-k material.

In a first aspect according to preferred embodiments, a method for producing a porogen-residue-free ultra low-k film having a k of 1.8-2.6, preferably a k<2.0, with a porosity higher than 40%, more preferably higher than 48% and an elastic modulus above 3.5 GPa such as above 5 GPa is disclosed, said method comprising at least the steps of:

(a) Providing a substrate, such as Si, (b) Depositing a low-k material (an organosilica matrix) comprising organic porogen (such as cyclic aromatic hydrocarbon), such as a SiCOH film using Plasma Enhanced Chemical Vapor Deposition (PE-CVD) or Chemical Vapor Deposition (CVD) or spin-on deposition, followed by (c) Performing a porogen removal step, such as by atomic hydrogen treatment at a wafer temperature in the range of 200° C. up to 430° C. during a time of 10-800 sec., preferably during 10-700 sec., and then followed by (d) Performing first a UV assisted thermal curing step, with a UV light having a wavelength higher or equal with 200 nm, at a wafer temperature in the range of 300° C. up to 500° C., thereby improving the chemical resistance of the low-k material against plasma and/or wet processing during the patterning steps, and (e) Performing a second a UV assisted thermal curing step, with a UV light having a wavelength lower than 200 nm, at a wafer temperature in the range of 300° C. up to 500° C., thereby improving the mechanical resistance of the low-k material during the chemical mechanical processing and/or packaging steps.

According to preferred embodiments, said atomic hydrogen treatment is performed in the afterglow of hydrogen comprising plasma thereby avoiding the presence of hydrogen excited radicals and ions, electrons, UV light. Said hydrogen comprising plasma may further comprise He or any other noble gases such as He, Ne, Ar, Kr, Xe, or the like in order to dilute the hydrogen plasma. Said addition of noble gases such as He may enhance the effect of hydrogen by increasing the number of H atoms in the afterglow of the hydrogen comprising plasma (i.e. increases depth of porogen removal normalized to exposure time).

According to preferred embodiments, said atomic hydrogen treatment is performed in the afterglow of a hydrogen comprising plasma, said hydrogen comprising plasma is characterized as having preferably a microwave power of around 100-2500 W (e.g. 2500 W), a gas pressure of 13.3 Pa (100 mTorr) up to 100-2500 Pa (several Torr) (e.g. 100 Pa (750 mTorr)). The gas flow of hydrogen is preferably in the range of 950 sccm hydrogen. Such conditions are experimentally found to provide optimal results, in terms of mechanical, chemical, and optical characteristics of films obtained. In case a noble gas is added to the plasma, the ratio of noble gas towards hydrogen is preferably from 5/1 to 50/1, such as 10/1 to 30/1, such as around 20/1, e.g. 4000 sccm He and 200 sccm $H_2$. Such conditions are experimentally found to provide optimal results, in terms of mechanical, chemical, and optical characteristics of films obtained.

According to preferred embodiments, said atomic hydrogen treatment is performed at elevated wafer temperature in the range of 200° C. up to 350° C., such as 250° C. up to 300° C., preferably around 280° C.

According to preferred embodiments, said atomic hydrogen treatment may be performed using other suitable techniques such as formation of atomic hydrogen using catalytic conversion reactions. An example hereof is using a hot Ti wire, and/or causing hydrolysis of $H_2$.

According to preferred embodiments, said atomic hydrogen treatment removes the porogen before an UV curing is applied. If a UV curing is applied without previous removal of porogen by said hydrogen treatment, the UV curing will only remove part of the porogen (volatile hydrocarbons), while another part of the porogen still remains in the film as carbon-rich residues. These carbon-rich residues (also referred to as amorphous carbon or conjugated polymer) are responsible for an unwanted high leakage current of the low-k film.

According to preferred embodiments, said first UV assisted thermal curing step is performed in a temperature range of 300° C. up to 500° C., such as from above 350° C. up to 450° C., more preferably at a temperature of 430° C.

According to preferred embodiments, said second UV assisted thermal curing step is performed in a temperature range of 300° C. up to 500° C., such as from above 350° C. up to 450° C., more preferably at a temperature of 430° C.

Examples

Table 1 shows comparative results of the mechanical properties of different low-k cured materials: sample 1 exposed to UV light having a wavelength lower or equal to 200 nm (A-cure); sample 2 exposed to UV light having a wavelength higher than 200 nm (B-cure);

Further Table 1 shows the mechanical properties of samples subjected to a sequence of steps according to a method of the preferred embodiments: sample 3—first B-cure then A-cure; sample 4—first B-cure then two times A-cure; and sample 5—first B-cure then four times A-cure.

When applying only B-cure the sample does not show sufficiently good mechanical properties. The curing sequence comprising a B-cure followed by at least one A-cure allows to achieve comparable Young Modulus with sample (only A-cure) and has the additional benefit of an enhanced chemical resistance during the patterning process/wet chemical process. Repeating the A-cure several times (e.g. samples 4 and 5) after performing B-cure enhances the mechanical properties further.

TABLE 1

| Sample | UV-assisted cure sequence | Young's modulus, GPa mean | stdev | Hardness, GPa mean | stdev |
|---|---|---|---|---|---|
| 1 | Cure A (<200 nm) | 6.75 | 0.79 | 0.73 | 0.07 |
| 2 | Cure B (≥200 nm) | 3.5 | 0.82 | 0.58 | 0.08 |
| 3 | Cure B + Cure A | 6.52 | 0.90 | 0.73 | 0.09 |
| 4 | Cure B + Cure AA | 8.88 | 0.90 | 0.88 | 0.10 |
| 5 | Cure B + Cure AAAA | 12.26 | 0.88 | 1.06 | 0.09 |

Figure 1B:
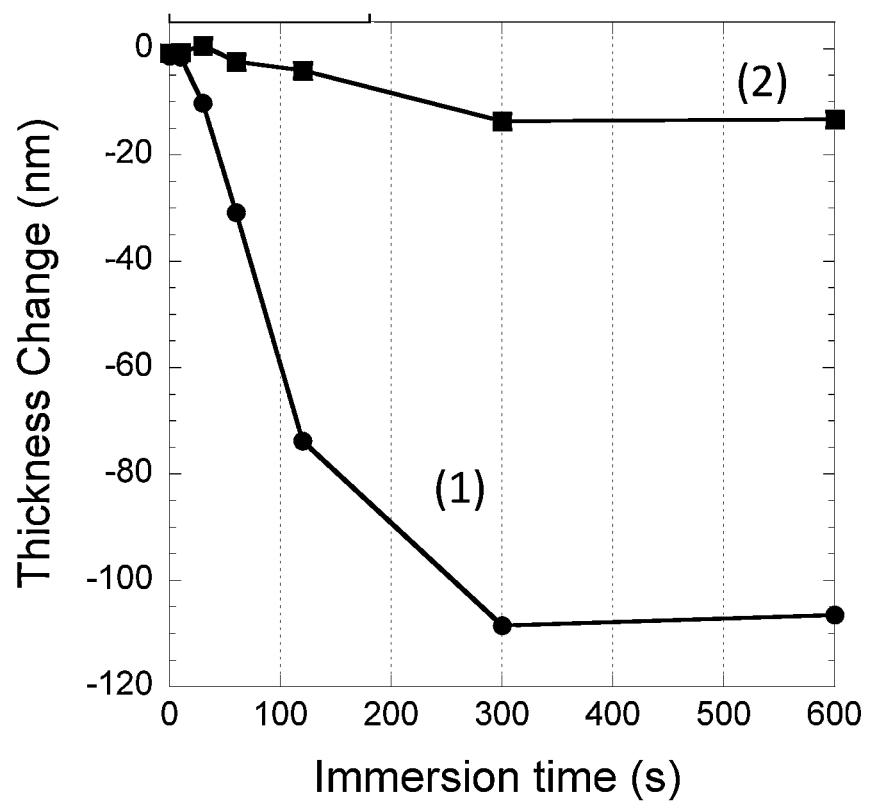
FIG. 1(b) illustrates the thickness change (a measure of the chemical stability) of an OSG low-k material as function of the immersion time in KOH 1% (pH>13) solution wherein said low-k material has been (1) treated with UV having a wavelength lower than 200 nm (A-cure), (2) treated with UV having a wavelength higher than or equal to 200 nm (B-cure)

Both FIGS. 1(a) and 1(b) show that the low-k material treated with B-cure has higher chemical stability, i.e. minor thickness change for longer immersion times, than the same low-k material treated with A-cure. The chemical resistance/stability of the low-k material treated first with B-cure and then with A-cure (3, FIG. 1a) decreases in comparison with the chemical stability of the low-k material treated only with B-cure, but it is still higher than the one of the low-k material treated only with A-cure.

Figure 2A:
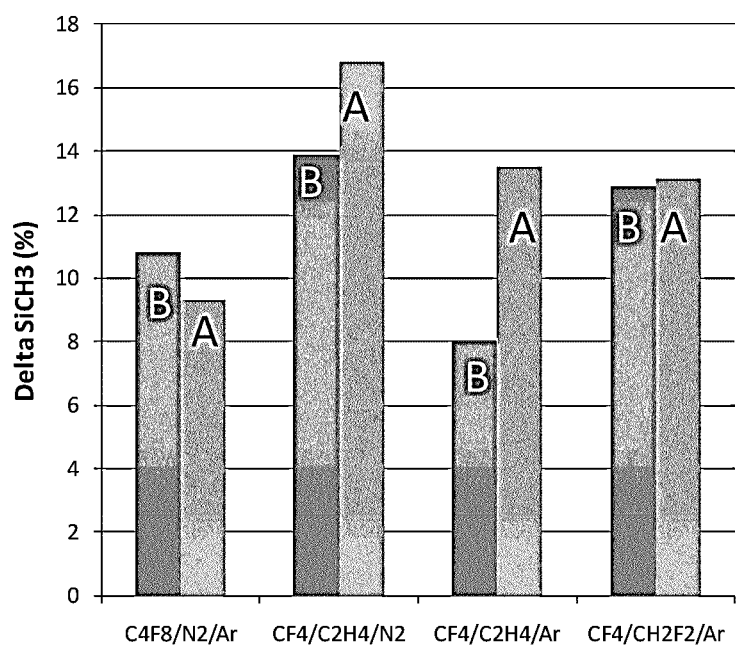
FIG. 2(a) shows the change in Si—$CH_3$ concentration as a measure of the degree of damage of an OSG low-k material after exposure to different etch plasmas (shown on x-axis) when said low-k material is first exposed to an A-cure (UV wavelength lower than 200 nm) or, respectively, to a B-cure (UV wavelength higher than or equal to 200 nm) before the etch plasma exposure.
Figure 2B:
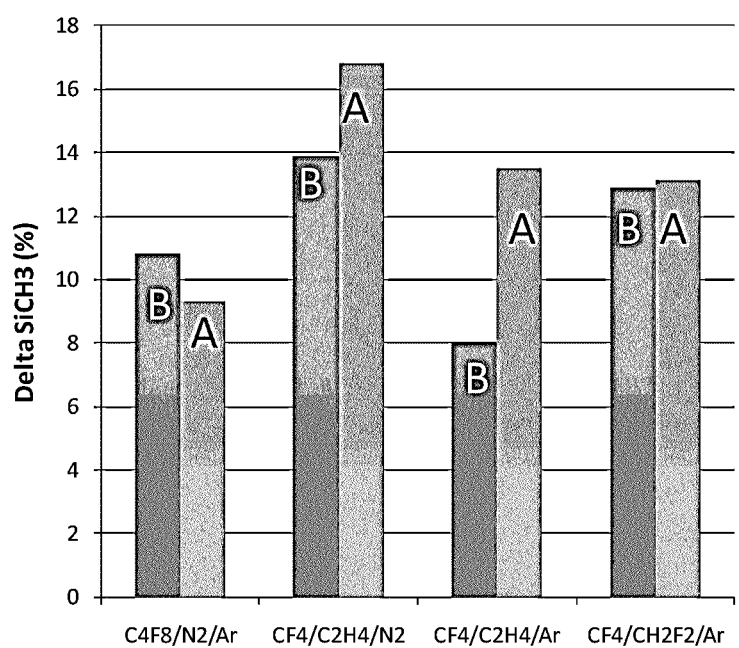
FIG. 2(b) shows the change in concentration of adsorbed OH-groups as a measure of the degree of damage of an OSG low-k material after exposure to different etch plasmas (shown on x-axis) when said low-k material is first exposed to an A-cure (UV wavelength lower than 200 nm) or, respectively, to a B-cure (UV wavelength higher than or equal to 200 nm) before the etch plasma exposure.

FIGS. 2(a) and 2(b) show measurements of plasma stability (degree of damage after etch plasma exposure) of the low-k materials treated with A-cure and respectively B-cure before exposing to the etch plasmas.

As shown in FIG. 2(a), for most of the etch plasmas, the change in Si—$CH_3$ concentration for the B-cured low-k materials is either comparable or lower than the change is Si—$CH_3$ concentration for the A-cured low-k materials. The lowest C-depletion is observed for a B-cured low-k material after exposure to $CF_4/C_2H_4/Ar$ plasma.

As shown in FIG. 2(b), for most of the etch plasmas, the OH integrated signal (as a measure of the degree of hydrophilization, which at its turn is a measure of the degree of plasma damage) is much smaller for the B-cured low-k materials than for the A-cured low-k materials. The lowest hydrophilization is observed for a B-cured low-k material after exposure to $CF_4/C_2H_4/Ar$ plasma.

Figure 3A:
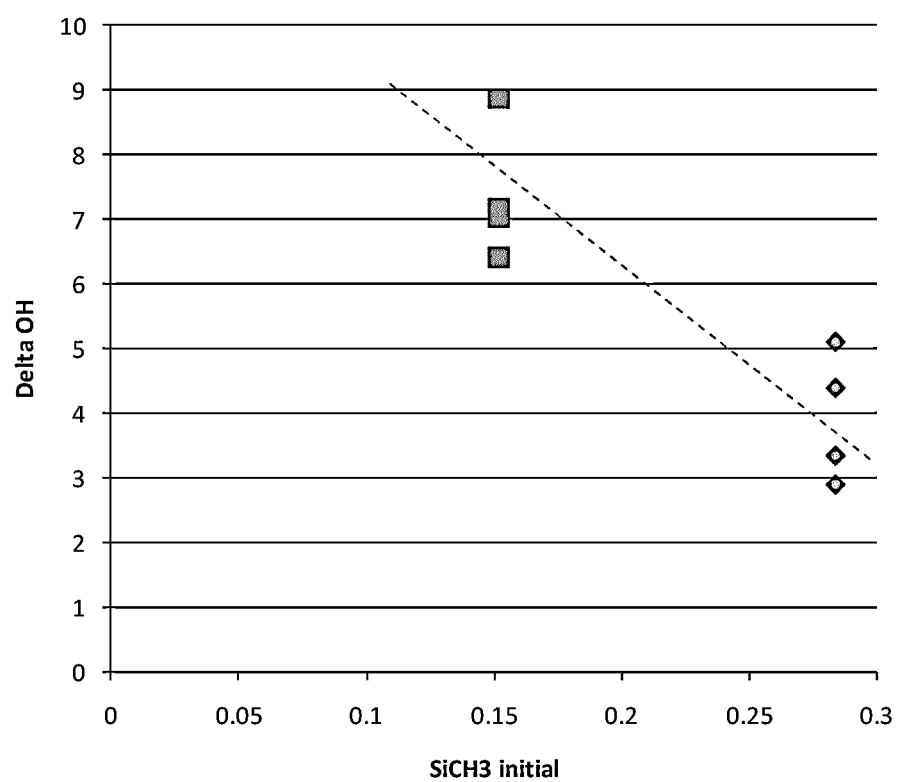
FIG. 3(a) illustrates the correlation between the concentration of adsorbed OH and the Si—CH$_3$ bonds concentration.
Figure 3B:
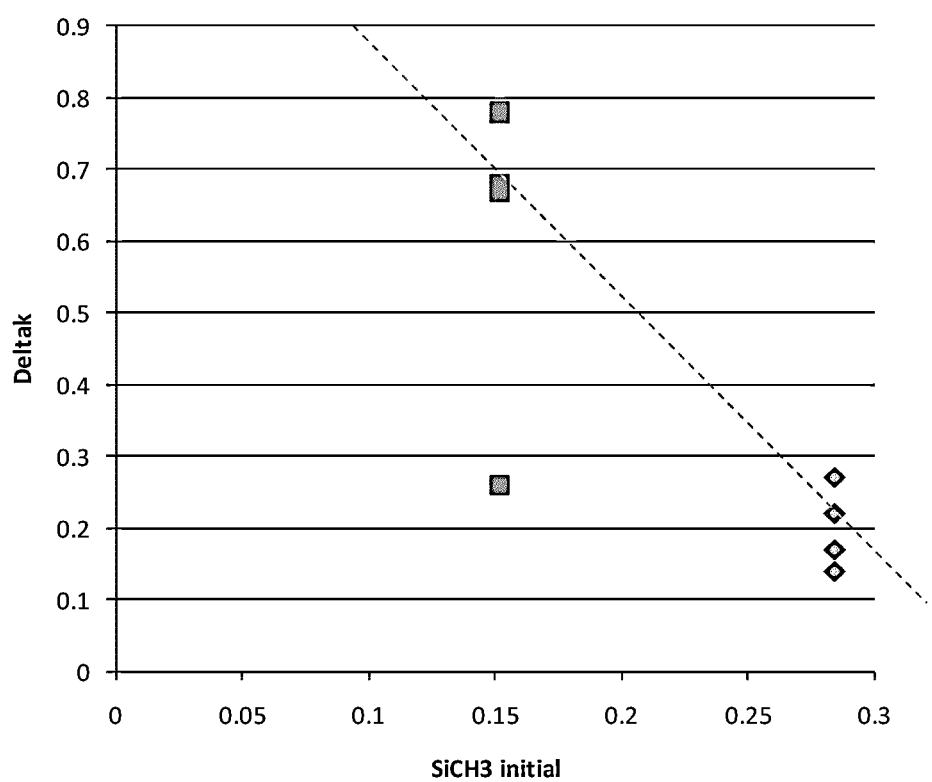
FIG. 3(b) illustrates the correlation between the k-value of the low-k material (square—A-cure; diamond—B-cure) and the Si—CH$_3$ bonds concentration.

As shown in both FIGS. 3(a) and 3(b) the B-cured low-k materials (diamond) have a higher plasma resistance than the A-cured low-k materials (square), since the degree of plasma damage is inversely proportional with the Si—$CH_3$ bonds concentration, which is higher for B-cured materials.

Figure 4:
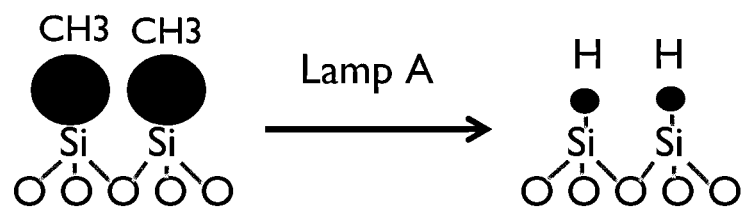
FIG. 4 shows schematically how a UV exposure with a wavelength lower than 200 nm (lamp A) decreases the concentration of terminating CH$_3$ groups.

FIG. 4 shows schematically how an exposure with a wavelength lower than 200 nm (lamp A) decreases the concentration of terminating—$CH_3$ groups and thereby improves the matrix cross-linkage (Young Modulus). Without wishing to be bound by theory, it is believed that the surface centers formed during removal of —$CH_3$ groups have tendency to be replaced by H atoms and, as a consequence thereof, the chemical and plasma stability decreases.

When the low-k material is exposed to etch plasmas, both F ions and radicals are preferentially attacking Si that has a positive charge. While the $CH_3$-bonds are present, the steric factor related to large size methyl groups protects the Si atoms from this attack, thereby improving the chemical and plasma resistance/stability of the low-k material.

A treatment with an UV radiation having a wavelength lower than 200 nm decreases the concentration of —$CH_3$ groups thereby improving the cross-linkage (Young Modulus of the low-k material) but, at the same time, the chemical and plasma stability is weakened.

In a second aspect a method for manufacturing an electronic device comprising the method for producing a porogen-residue-free ultra low-k film is disclosed.

The method for manufacturing an electronic device further comprises performing at least a patterning step of the low-k material in between step (d) and step (e).

The patterning step comprises a plasma processing step such as dry-etch plasma and/or a wet processing step. In specific embodiments the dry-etch plasma comprises fluorinated ions and/or radicals.

In particular embodiments the dry-etch plasma may comprise $C_4F_8/N_2/Ar$, $CF_4/C_2H_4/N_2$, $CF_4/C_2H_4/Ar$, $CF_4/CH_2F_2/Ar$ or mixtures and combinations thereof. Further, in specific embodiments the wet processing step is performed with a solution comprising HF.

In embodiments, the method for manufacturing an electronic device further comprises performing a chemical mechanical polishing (CMP) step after step (e).

In a third aspect, according to preferred embodiments, a low-k film is provided, such as an inter-layer-dielectric (ILD) or inter-metal-dielectric (IMD), having a k-value k of 1.8-2.6, preferably a k<2.0, having a porosity of 41%-60%, preferably higher than 48%, and high elastic modulus of above 3.5 GPa, preferably above 5 GPa, such as above 7 GPa, such as 9.5 GPa.

Further, the low-k film has preferably a thickness of 50-200 nm, preferably having an open porosity of less than 40%, such as 32%-36%, preferably having an average pore radius from 0.6-3.0 nm, more preferably from 0.7-2 nm, most preferably from 0.8-1.8 nm, such as from 1.5-1.6 nm. Said by example SiCOH deposited low-k film is further characterized as not having (or almost completely free of) porogen or porogen residues in the skeleton of the SiCOH matrix of the low-k film. Such superior films are not provided by prior art methods.

Furthermore, the use of the method according to examples in the fabrication of a low-k film is disclosed wherein the achieved low-k film is used as a dielectric material in between interconnect structures in semiconductor devices.

In a further aspect, an electronic element, such as diode, transistor, MEMS, capacitor, comprising a low-k film according to preferred embodiments is provided.

In a further aspect according to preferred embodiments a semiconductor device comprising a low-k film is disclosed.

In a further aspect according to preferred embodiments an integrated circuit comprising a low-k film is disclosed.

In a further aspect according to preferred embodiments an electronic equipment or component, such as an RFID, television, audio, video, telephone, microphone, comprising a semiconductor device, and/or an integrated circuit according, and/or an electronic element is disclosed comprising the low-k film according to preferred embodiments.

What is claimed is:

1. A method for producing a porogen-residue free ultra low-k film, comprising:
   (a) depositing a low-k material comprising an organic porogen on a substrate by at least one technique selected from the group consisting of plasma enhanced chemical vapor deposition, chemical vapor deposition, and spin-on deposition; thereafter
   (b) subjecting the deposited low-k material comprising the organic porogen to atomic hydrogen treatment at a substrate temperature of from 200° C. to 430° C. for a time of from 10 sec. to 800 sec., whereby the organic porogen is removed, wherein the atomic hydrogen treatment is performed in an afterglow of hydrogen-comprising plasma while avoiding a presence of hydrogen-excited radicals and ions, electrons, and UV light; thereafter
   (c) performing a first UV-assisted thermal curing step with a UV light having a wavelength higher than or equal to 200 nm and at a substrate temperature of from 300° C. to 500° C., whereby the deposited low-k material is cured without depleting Si—$CH_3$ bonds, whereby a chemical resistance of the deposited low-k material is increased while a lower mechanical resistance is imparted; thereafter
   (d) subjecting the deposited low-k material to at least one of patterning and wet chemical processing; and thereafter
   (e) performing a second UV-assisted thermal curing step with a UV light having a wavelength lower than 200 nm and at a substrate temperature of from 300° C. to 500° C., whereby cross-linking reactions are promoted, whereby a mechanical resistance of the deposited low-k material is increased,
   whereby a porogen-residue free ultra low-k film having a k-value of from 1.8 to 2.6, a porosity higher than 40%, and an elastic modulus above 5 GPa is obtained.

2. The method of claim 1, further comprising repeating step (e) at least once.

3. The method of claim 2, further comprising, after repeating step (e):
   (f) conducting at least one of chemical mechanical polishing and packaging.

4. The method of claim 3, further comprising, after step (d) and before step (f), wherein step (d) comprises subjecting the deposited low-k material to patterning:

depositing one or more sealing and/or barrier thin film layers on patterned structures defined in the deposited low-k material.

5. The method of claim 3, further comprising, after step (d) and before step (f), wherein step (d) comprises subjecting the deposited low-k material to patterning:
filling patterned structures defined in the deposited low-k material with a metal.

6. The method of claim 1, wherein the porogen-residue free ultra low-k film is a part of an electronic device.

7. The method of claim 1, wherein the porogen-residue free ultra low-k film has a thickness of 50-200 nm, an open porosity of less 32%-36%, and an average pore radius from 0.8-1.8 nm.

8. A method for manufacturing an electronic device, comprising:
(a) depositing a low-k material comprising an organic porogen on a substrate by at least one technique selected from the group consisting of plasma enhanced chemical vapor deposition, chemical vapor deposition, and spin-on deposition; thereafter
(b) subjecting the deposited low-k material comprising the organic porogen to atomic hydrogen treatment at a substrate temperature of from 200° C. to 430° C. for a time of from 10 sec. to 800 sec., whereby the organic porogen is removed, wherein the atomic hydrogen treatment is performed in an afterglow of hydrogen-comprising plasma while avoiding a presence of hydrogen-excited radicals and ions, electrons, and UV light; thereafter
(c) performing a first UV-assisted thermal curing step with a UV light having a wavelength higher than or equal to 200 nm and at a substrate temperature of from 300° C. to 500° C., whereby the deposited low-k material is cured without depleting Si—$CH_3$ bonds, whereby a chemical resistance of the deposited low-k material is increased while a lower mechanical resistance is imparted; thereafter
(d) patterning the deposited low-k material at least once; and thereafter
(e) performing a second UV-assisted thermal curing step with a UV light having a wavelength lower than 200 nm and at a substrate temperature of from 300° C. to 500° C., whereby cross-linking reactions are promoted, whereby a mechanical resistance of the patterned deposited low-k material is increased, wherein the patterned deposited low-k material is porogen-residue free and has a k-value of from 1.8 to 2.6, a porosity higher than 40%, and an elastic modulus above 5 Gpa.

9. The method of claim 8, wherein the patterning comprises a plasma processing step.

10. The method of claim 9, wherein the plasma processing step utilizes a dry-etch plasma.

11. The method of claim 10, wherein the dry-etch plasma comprises at least one of fluorinated ions or fluorinated radicals.

12. The method of claim 8, wherein the patterning comprises a wet processing step.

13. The method of claim 12, wherein the wet processing step is performed with a solution comprising HF.

14. The method of claim 8, wherein the patterned deposited low-k material has a thickness of 50-200 nm, an open porosity of less 32%-36%, and an average pore radius from 0.8-1.8 nm.

15. A method for manufacturing an electronic device, comprising:
(a) depositing a low-k material comprising an organic porogen on a substrate by at least one technique selected from the group consisting of plasma enhanced chemical vapor deposition, chemical vapor deposition, and spin-on deposition; thereafter
(b) subjecting the deposited low-k material comprising the organic porogen to atomic hydrogen treatment at a substrate temperature of from 200° C. to 430° C. for a time of from 10 sec. to 800 sec., whereby the organic porogen is removed, wherein the atomic hydrogen treatment is performed in an afterglow of hydrogen-comprising plasma while avoiding a presence of hydrogen-excited radicals and ions, electrons, and UV light; thereafter
(c) performing a first UV-assisted thermal curing step with a UV light having a wavelength higher than or equal to 200 nm and at a substrate temperature of from 300° C. to 500° C., whereby the deposited low-k material is cured without depleting Si—$CH_3$ bonds, whereby a chemical resistance of the deposited low-k material is increased; thereafter
(d) performing a second UV-assisted thermal curing step with a UV light having a wavelength lower than 200 nm and at a substrate temperature of from 300° C. to 500° C., whereby cross-linking reactions are promoted, whereby a mechanical resistance of the deposited low-k material is increased; and thereafter
(e) performing a chemical mechanical polishing step on the deposited low-k material, wherein the polished deposited low-k material is porogen-residue free and has a k-value of from 1.8 to 2.6, a porosity higher than 40%, and an elastic modulus above 5 Gpa.

16. The method of claim 15, wherein the polished deposited low-k material has a thickness of 50-200 nm, an open porosity of less 32%-36%, and an average pore radius from 0.8-1.8 nm.

* * * * *